United States Patent [19]

Yeo

[11] 4,137,953

[45] Feb. 6, 1979

[54] EXHAUST HEAD

[75] Inventor: Ernest E. Yeo, Wenham, Mass.

[73] Assignee: Swanson-Erie Corporation, Erie, Pa.

[21] Appl. No.: 841,969

[22] Filed: Oct. 13, 1977

[51] Int. Cl.[2] .......................... B65B 31/04; G01M 3/02; H01J 9/38; H01J 9/42

[52] U.S. Cl. .......................................... 141/65; 73/40; 141/83; 316/30

[58] Field of Search .................... 641/66, 65; 141/7, 8, 141/59, 61, 69, 83; 316/30, 31; 73/40, 41, 45, 45.1, 45.2

[56] References Cited

U.S. PATENT DOCUMENTS

| | | | |
|---|---|---|---|
| 3,140,734 | 7/1964 | Chauvin | 141/66 |

*Primary Examiner*—Houston S. Bell, Jr.
*Attorney, Agent, or Firm*—Charles L. Lovercheck

[57] ABSTRACT

A coupling head suitable to be supported on a transporting means for coupling an object to be evacuated to a vacuum line. The coupling has a ball valve and a poppet valve for connecting and disconnecting the vacuum and gas pressure to the object. Leaks in the object can be detected by a sensing device actuated by a bellows on the coupling head.

7 Claims, 5 Drawing Figures

EXHAUST HEAD

GENERAL DESCRIPTION OF THE INVENTION

The invention relates to a vacuum system that uses a head that can be mounted on any transporting means such as an index turret, race-track-type conveyor or an over-under conveyor. The vacuum or pressure is supplied to the head at each dwell position by means of a coupling which is the subject matter of this disclosure. A race-track type machine is shown in U.S. Pat. No. 3,039,597.

The head is attached to the envelope to be evacuated or filled. The invention comprises: (a) a head consisting of a means for supporting the object to be evacuated, filled and tested for leakage, (b) a ball valve used to divert the flow from the vacuum passage to the gas-filled passage leading to the envelope, (c) a poppet-type valve that will seal the supply port before the head leaves the coupling that connects the head to the backup manifolds, (d) the bellows or diaphragm assembly installed in the head to determine the amount of pressure in the envelope. The pressure will produce a physical change in the height of the bellows enabling a switch to determine whether the pressure is within predetermined limits, (e) a linkage that will be manipulated by an outside force when a leak in the envelope occurs. By moving the linkage, the poppet valve in the head is not lifted off the seat when the coupling is made to back up manifolds. When this occurs, any leak in the envelope will not get back to the supply manifolds.

OBJECTS OF THE INVENTION

It is an object of the invention to provide an improved vacuum system for a conveyor-type machine.

Another object of the invention is to provide a vacuum system and head that is simple in construction, economical to manufacture and simple and efficient to use.

Another object of the invention is to provide an improved vacuum system head.

With the above and other objects in view, the present invention consists of the combination and arrangement of parts hereinafter more fully described, illustrated in the accompanying drawings and more particularly pointed out in the appended claims, it being understood that changes may be made in the form, size, proportions, and minor details of construction without departing from the spirit or sacrificing any of the advantages of the invention.

GENERAL DESCRIPTION OF THE DRAWINGS

DETAILED DESCRIPTION OF THE DRAWINGS

Figure 1:
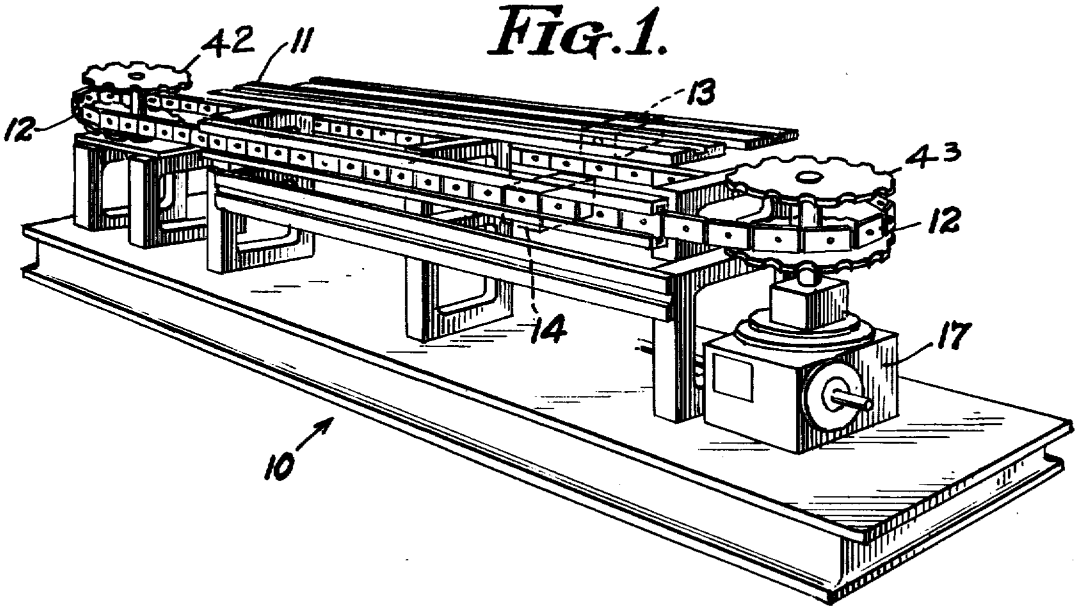
FIG. 1 is an isometric view of an assembly machine incorporating the vacuum head according to the invention.
Figure 2:
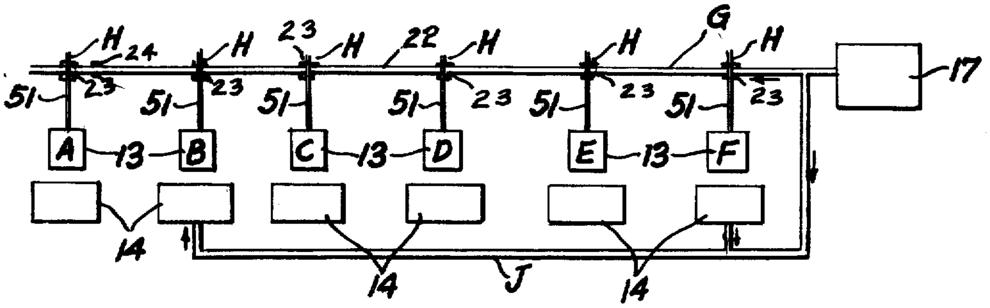
FIG. 2 is a diagrammatic view showing the assembly heads and couplings for connecting them to a source of vacuum.
Figure 3:
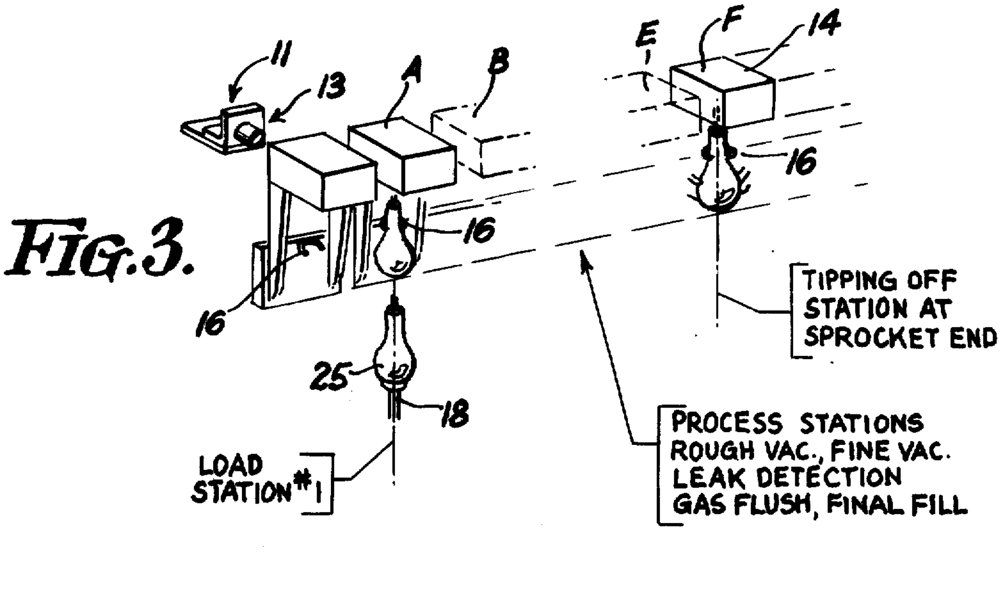
FIG. 3 is another diagrammatic view showing a side view of the machine.
Figure 4:
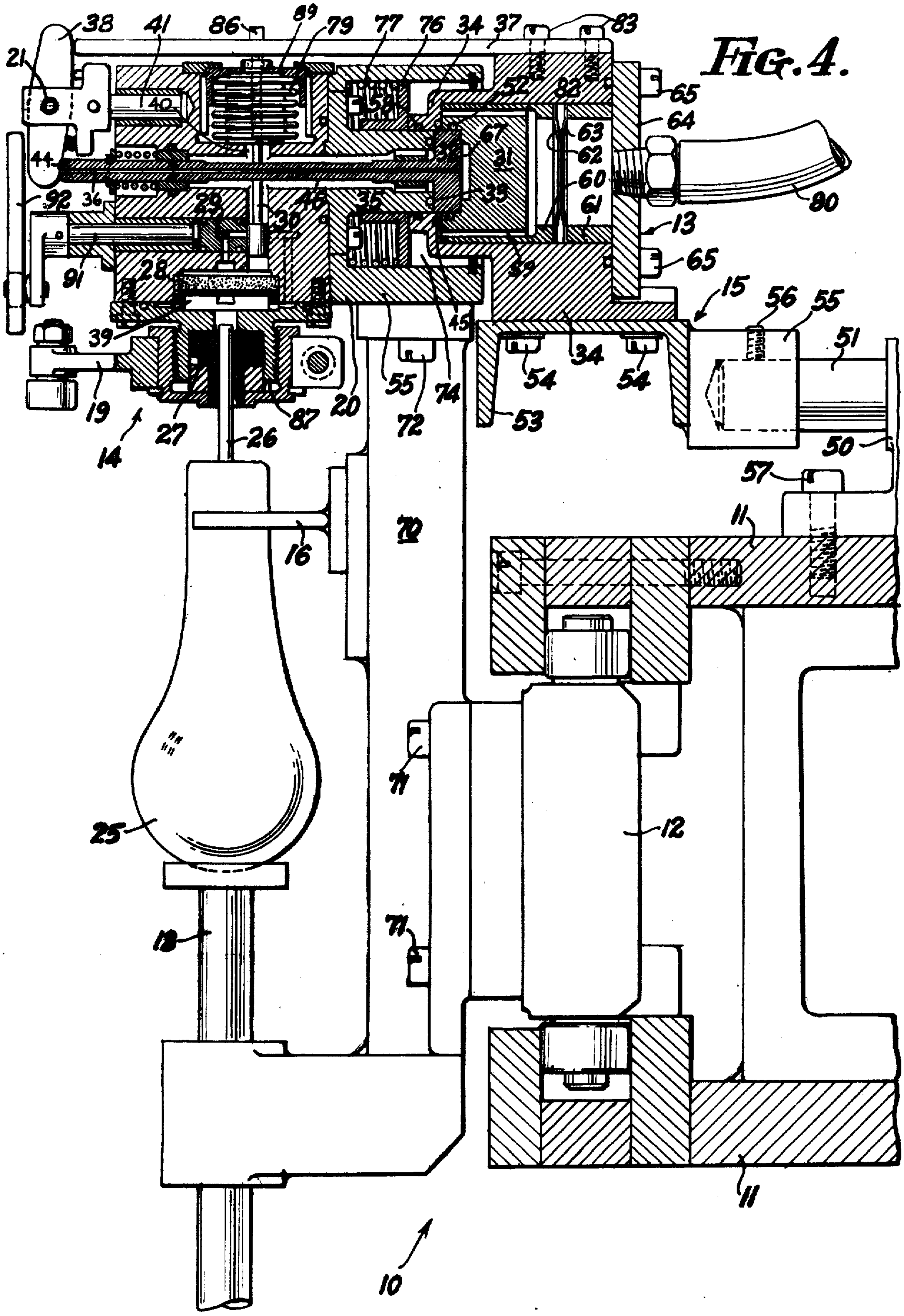
FIG. 4 is a longitudinal, cross-sectional view.
Figure 5:
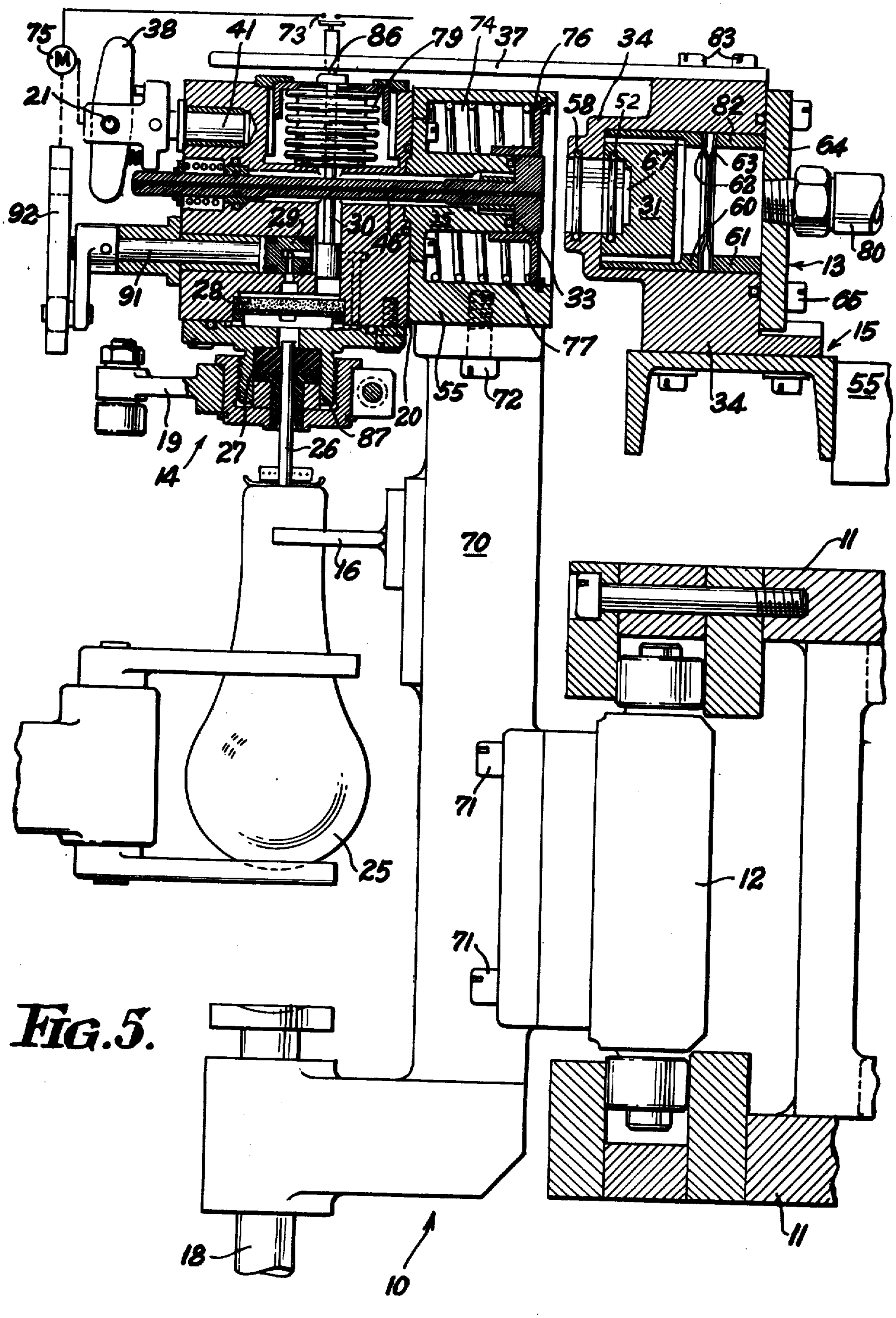
FIG. 5 is a view similar to FIG. 4 showing the coupling moved into engagement with the exhaust head.

Now, with more particular reference to the drawings, the assembly machine 10 is generally shown in FIG. 1 and diagramatically shown in FIGS. 2 and 3. It has a frame 11 and transporting means 12 which may be the conveyor shown in FIG. 1 supported on the spaced sprockets 42 and 43. The indexing drive 17 is connected to these sprockets 42 and 43 to drive the transporting means 12 intermittently from one dwell position to another, the machine having dwell positions A, B, C, D, E, and F. The cam shaft 22 has spaced cams 23 at each of the dwell positions A through F, each of which engage one of the rams 51 which support the couplings 13. The cams 23 on the cam shaft 22 move the couplings 13 from the retracted position shown in FIG. 5 to the connected position connecting coupling 13 to the exhaust head 14 as shown in FIG. 4.

In the manufacture of incandescent lamp bulbs, it is sometimes necessary to perform a sequence of operations on the lamp, for example, to evacuate the lamp, then test the efficiency of evacuation, introduce an inert gas into the lamp, and test the pressure of the gas in the lamp. This requires the lamp to be connected and disconnected in sequence to a number of sources of vacuum, tests and gas supply. The machine disclosed herein is suitable to perform these functions by means of the exhaust heads 14, which carry the lamp envelopes to be processed and the couplings 13 that are supported at spaced stations on the fixed frame of the machine. The assembly machine 10, shown in FIG. 1, which can support any desired number of couplings 13 in spaced sequential relation thereon, can support any desired number of exhaust heads 14 on its transporting means 12. The assembly machine, shown in FIG. 1, is of the race-track type of assembly machine, but it could be any other well-known type, for example, a turret-type machine, or any other suitable type.

This machine will move a container, such as the envelope 25 in which it is desirable to induce a vacuum or introduce a particular gas atmosphere, as in an incandescent lamp bulb, for example, and perform other operations such as testing. The envelope 25 could be loaded at position A, evacuated at position B, tested at position C, gas introduced at position D, tested at position E and removed or unloaded at position F, for example. Couplings 13 are supported on the rams 51 which are slidably supported on the machine frame 11 in bearings 50, that are sealed to the machine frame 11 by means of studs 57. The rams 51 are received in blocks 55 and held in place therein by screws 56. The channels 53 are welded to the blocks 55 at weld 15 and fixed to the gland 34 of the coupling 13 by studs 54. Coupling 13 has a spool 31 which is slidably supported in gland 60. The "O"-ring 52 is received in an internal groove in a cavity in the spool 31 and makes sealing contact with the head of valve 32 when the coupling 13 is in the forward position shown in FIG. 4. The torsion springs 62 and 63 permit the gland 60 to move toward the gland 61 when the spool 31 is engaged by the valve 32. The gland 34 has hose 80, through which the gas can be evacuated from or introduced to the envelope 25. A push rod 37 is fixed to the gland by bolts 83 and engages the rocker arm 38 which, in turn, engages the stem 46 of the valve 32 to open it when the coupling 13 is moved forward into the position shown in FIG. 4.

The exhaust head 14 has a body 20 that is supported on the transporting means 12 by the bracket 70 and the bracket 70 is held to the transporting means 12 by means of studs 71 and held to the body 20 by the studs 72. The gland 35 is fixed to the body 20 inside a cylindrical bore 74 therein and the ring 76 is slidable on the internal surface of cylindrical bore 74 of the gland 35 and moves inside the bore 74 against the force of compression spring 77 which urges the ring 76 outward toward spool 31.

The body 20 has a downwardly extending bore which receives a bellows 79. The detent 86 of the bellows 79 extends upwardly and may engage a switch 73 connected to an indicator to indicate leaks in the envelope 25.

A threaded gland 87 is supported on the lower part of the body 20 and it is actuated by the clamping lever 19 which is, in turn, actuated from a cam 24 on the cam shaft 22 to compress the resilient washer 27 on the tube 26 when the envelope 25 is loaded.

A filter 28 is supported in the bore 39 above the resilient washer 27, and below the valve 29.

When the machine indexes the transporting means 12 moving an exhaust head 14 to the dwell position 1, a cam 23 on cam shaft 22 driven by the indexing drive 17 will lift an envelope 25 up to the exhaust head 14 by means of the plunger 18 pushing tube 26 into resilient washer 27. Lever 19 will then be rotated by a suitable cam on the machine, compressing the resilient washer 27 around the tube 26. Bracket 16 will prevent lateral movement of the loaded envelope 25.

The envelope 25 is supported by glass tube 26 in a manner familiar to those skilled in the art. When coupling 13 is moved beyond the seal of the poppet valve 32, further movement of the coupling 13 and gland 34 brings push rod 37 into engagement with rocker arm 38. Rocker arm 38 rotates on pivot 21, and contacts the stem 44 of valve 32. Moving the valve 32 from its seat on O-ring 33 and moving spool 31 from engagement with the O-ring 45. Grooves 59 running the length of the spool 31 allow air to flow from the envelope 25 through the grooves 59 in the spool 31, to the hose 80. The hole 36 in the center of valve 32 allows the air trapped behind the valve in space 67 to pass out to the atmosphere. When the coupling 13 is moved away from the exhaust head 14, push rod 37 moves away from rocker arm 38 and valve 32 closes sealing on O-ring 33 trapping the vacuum in the envelope 25.

The bellows 79 installed in the exhaust head 14, determines the amount of pressure in the envelope, and the pressure will produce a physical change in the height of the bellows enabling a suitable switch 73 engaging detent 86 to determine whether the pressure is within predetermined limits for test purposes.

To accomplish this, a signal received from the push rod 37 probing the position of the detent 86 on the bellows is picked up by a motor 75 which will rotate shaft 41, moving lever 38 out of the path of rod 37. By moving the push rod 37, the poppet valve in the head is not lifted off the seat, when the coupling is moved forward. When this occurs, any envelope 25 having a leak will be isolated from the supply manifold connected to the hose 80.

The bellows 79 is mounted in the exhaust head 14 with the passageway 40 leading to the space 46 around the stem 44 of the valve 32. When the exhaust head 14 is evacuated, the bellows 79 is collapsed and when the bellows 79 is in normal state, a detent 86 on the bellows protrudes through a hole-down in ring 89. The position of the detent 86 determines the state of vacuum in the envelope. When the bellows 79 indicates that the envelope 25 has a leak, the exhaust head 14 should be disconnected from the manifold coupling 13 so that the pressure in the manifold will not be adversely affected.

The head of the valve 32 is generally cylindrical. The vacuum head has the gland 34 which has a hollow cylindrical cavity thereon that is moved over the cylindrical head of valve 32 by cam and follower 63 when the machine indexes the exhaust head 14 into position adjacent the coupling 13. Valve 29 also has a cylindrical head and in the position shown, its angular passage connects air from envelope 25 through the filter 28, through the angular passage in valve 29, and through the space 46.

When motor 75 has rotated shaft 91 through connecting rod 92 to rotate the angular passage through valve 29 out of alignment with the passage through the head 14, the valve 29 will act in series with the valve 32. Thus, when the bellows 79 is expanded, closing switch 73, and thus energizing motor 75, to move the rocker 38 out of alignment with rod 37, the poppet valve 31 will not open and flow of air from envelope 25 will be interrupted. The valve 29 being rotated by motor 75 when energized by switch 73 will also prevent flow of air from envelope 25 and, therefore, act in series with valve 31.

The foregoing specification sets forth the invention in its preferred practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. In combination, an exhaust head (14) and a coupling (13) for removing air from, or introducing gas to, an envelope (25) comprising,
   - said exhaust head (14) being adapted to be supported on a moveable member (12) of a machine (10) having a plurality of dwell positions thereon,
   - said exhaust head (14) having resilient means (27) for receiving a tubular member (26) attached to said envelope (25),
   - a coupling (13) adapted to be supported on said machine at said dwell position,
   - said exhaust head (14) having a poppet valve having a generally cylindrical head (32) extending therefrom,
   - said coupling (13) having a gland (35) with a hollow cylindrical cavity therein receiving said poppet valve head (32),
   - and means on said machine to move said coupling (13) toward said exhaust head (14),
   - and means in said gland (35) to connect a vacuum head to said coupling (13) when said poppet valve head (32) is received in said gland,
   - said poppet valve head (32) has an elongated stem (36) attached to it extending outward from said exhaust head,
   - a rocker lever (38) is supported on said exhaust head (14) engaging said stem,
   - and rod means on said coupling (13) engaging said rocker arm holding said poppet valve head (32) open, connecting said coupling to said tubular member (26) and spring means on said valve stem (36) urging said poppet valve head (32),
   - a rotary valve means (29) is connected in series with said poppet valve head,
   - actuating means (92) connected to said rotary valve, and means to engage said actuating means (92) to rotate said rotary valve and disconnect said coupling (13) from said envelope (25) when said exhaust head is moved to position on said machine, a diaphragm means (79) is connected to said tube on said machine, said diaphragm means (79) having means (86, 73, 75) to engage an actuating member for disengaging said poppet valve head from said rocker arm when said diaphragm is extended during evacuation of said envelope.

2. The combination recited in claim 1 wherein said cylindrical cavity in said vacuum head has a cylindrical spool reciprocally received therein, said spool having a hollow cylindrical cavity therein receiving the head of said poppet valve, a sealing ring in said hollow cavity making sealing engagement with said exhaust head around said poppet valve head when said poppet valve is closed and a spring in said cavity in said vacuum head urging said spool toward said vacuum head, said spool being adapted to move with said poppet valve against the force of said spring when said poppet valve is moved to open position, opening an air passage in said vacuum head and connecting said vacuum head in air flow relation with said exhaust valve.

3. The combination recited in claim 2 wherein said poppet valve has an elongated stem extending through said exhaust head and an air passage is provided around the outside of said poppet valve stem communicating with the space adjacent the head thereof, said poppet valve rests on said sealing means concentric with said passage.

4. The combination recited in claim 2 wherein said poppet valve has axially-extending opening therein extending entirely therethrough and connecting the space between said poppet valve and the inside of said spool to the outside for venting said space bleeding air therefrom.

5. The combination recited in claim 4 wherein a said exhaust head has a cylindrical gland and said poppet valve has a stem thereon extending axially through said cylindrical gland and a spring-loaded collar slidably supported on said gland adapted to engage said gland on said exhaust head for uring said exhaust head away from said poppet valve.

6. The combination recited in claim 1 wherein said cylindrical cavity in said vacuum head has a cylindrical spool reciprocally received therein, said spool having a hollow cylindrical cavity therein receiving the head of said poppet valve, a sealing ring in said hollow cavity making sealing engagement with said exhaust head around said poppet valve head when said poppet valve is closed and a spring in said cavity in said vacuum head urging said spool toward said vacuum head, said spool being adapted to move with said poppet valve against the force of said spring when said poppet valve is moved to open position, opening an air passage in said vacuum head and connecting said vacuum head in air flow relation with said exhaust valve.

7. The combination recited in claim 9 wherein said poppet valve has an axially-extending opening therein extending entirely therethrough and connecting the space between said poppet valve and the inside of said spool to the outside for venting said space bleeding air therefrom.

* * * * *